(12) United States Patent
Deng

(10) Patent No.: US 10,453,797 B2
(45) Date of Patent: Oct. 22, 2019

(54) INTERCONNECTION STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Hao Deng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/821,581

(22) Filed: Nov. 22, 2017

(65) Prior Publication Data

US 2018/0151505 A1 May 31, 2018

(30) Foreign Application Priority Data

Nov. 29, 2016 (CN) .......................... 2016 1 1076275

(51) Int. Cl.
*H01L 23/532* (2006.01)
*H01L 21/02* (2006.01)
(Continued)

(52) U.S. Cl.
CPC .... *H01L 23/53295* (2013.01); *H01L 21/0228* (2013.01); *H01L 21/02145* (2013.01);
(Continued)

(58) Field of Classification Search
None
See application file for complete search history.

(56) References Cited

U.S. PATENT DOCUMENTS

| 5,384,269 A * | 1/1995 | Cho ................ H01L 21/26546 438/522 |
| 2008/0251922 A1 * | 10/2008 | Shih ................ H01L 21/76846 257/754 |

(Continued)

FOREIGN PATENT DOCUMENTS

CN 106876325 A 6/2017

OTHER PUBLICATIONS

The European Patent Office (EPO) The Extended European Search Report for 17203761.6 dated May 11, 2018 9 Pages.

*Primary Examiner* — Lex H Malsawma
(74) *Attorney, Agent, or Firm* — Anova Law Group, PLLC

(57) ABSTRACT

A method for fabricating an interconnection structure includes providing a substrate, forming a dielectric layer on the substrate, forming a conductive structure in the dielectric layer, forming a cap layer doped with silicon on the conductive structure and the dielectric layer, and performing an annealing process on the conductive structure and the cap layer. During the annealing process, the silicon ions in the cap layer react with the material of the conductive structure and form chemical bonds. As such, the connection strength between the cap layer and the conductive structure is improved, which is conducive to suppressing electro migration in the formed interconnection structure. Therefore, the reliability of the formed interconnection structure is improved.

19 Claims, 4 Drawing Sheets

(51) Int. Cl.
    *H01L 21/768*     (2006.01)
    *H01L 23/528*     (2006.01)

(52) U.S. Cl.
    CPC .. *H01L 21/02178* (2013.01); *H01L 21/02211* (2013.01); *H01L 21/02315* (2013.01); *H01L 21/76832* (2013.01); *H01L 21/76834* (2013.01); *H01L 21/76877* (2013.01); *H01L 21/76883* (2013.01); *H01L 21/76895* (2013.01); *H01L 23/5283* (2013.01); *H01L 23/53228* (2013.01); *H01L 21/76828* (2013.01)

(56) References Cited

U.S. PATENT DOCUMENTS

| | | | |
|---|---|---|---|
| 2009/0004850 A1* | 1/2009 | Ganguli | C23C 16/18 438/655 |
| 2009/0108451 A1 | 4/2009 | Hwang | |
| 2009/0269507 A1* | 10/2009 | Yu | H01L 21/02074 427/535 |
| 2011/0127650 A1* | 6/2011 | Witvrouw | B81C 1/00333 257/622 |
| 2014/0175450 A1* | 6/2014 | Disney | H01L 29/0615 257/76 |
| 2016/0172239 A1* | 6/2016 | Padhi | H01L 21/0214 257/639 |
| 2016/0307766 A1 | 10/2016 | Jongbloed et al. | |

* cited by examiner

INTERCONNECTION STRUCTURES AND FABRICATION METHODS THEREOF

CROSS-REFERENCES TO RELATED APPLICATIONS

This application claims the priority of Chinese Patent Application No. CN201611076275.9, filed on Nov. 29, 2016, the entire content of which is incorporated herein by reference.

FIELD OF THE DISCLOSURE

The present disclosure generally relates to the field of semiconductor fabrication technology and, more particularly, relates to interconnection structures and fabrication methods thereof.

BACKGROUND

With the continuous development of integrated circuits (ICs) manufacturing technology, the requirements on the integration level and the performance of the ICs have become increasingly high. In order to improve the degree of integration and reduce production cost, the critical dimension of electronic components is steadily reduced and the circuit density in the ICs continuously increases. Such development makes the wafer surface unable to provide enough area for the fabrication of interconnections.

Currently, to accommodate the requirements for fabricating interconnections as the critical dimensions become smaller, interconnection structures are usually used to connect different metal layers or connect a metal layer with a substrate. As the technology node advances, the dimension of interconnection structures also becomes smaller and smaller.

As the dimension of interconnection structures becomes smaller, the reliability of conventional interconnection structures needs to be improved. The disclosed interconnection structures and fabrication methods thereof are directed to solve one or more problems set forth above and other problems in the art.

BRIEF SUMMARY OF THE DISCLOSURE

One aspect of the present disclosure includes a method for fabricating an interconnection structure. The method includes providing a substrate, forming a dielectric layer on the substrate, forming a conductive structure in the dielectric layer, forming a cap layer doped with silicon on the conductive structure and the dielectric layer, and performing an annealing process on the conductive structure and the cap layer.

Another aspect of the present disclosure provides an interconnection structure. The interconnection structure includes a substrate, a dielectric layer formed on the substrate, a conductive structure formed in the dielectric layer, and a cap layer doped with silicon and formed on the conductive structure and the dielectric layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
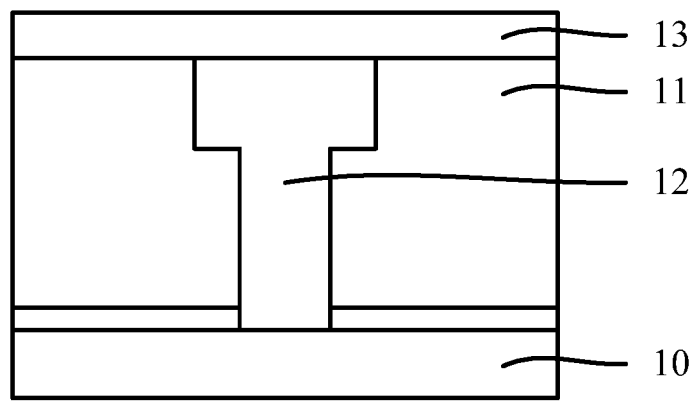
FIG. 1 illustrates a schematic cross-section view of an interconnection structure.

FIG. 1 illustrates a schematic cross-section view of an interconnection structure. Referring to FIG. 1, the interconnection structure includes a substrate 10, a dielectric layer 11 formed on the substrate 10, a conductive structure 12 formed in the dielectric layer 11, and a cap layer 13 formed on the dielectric layer 11 and the conductive structure 12. The conductive structure further includes a plug (not shown) and an interconnection (not shown) formed on the plug.

Driven by a static electric field, electrons in the semiconductor structure move very quickly from the cathode to the anode, and in the meantime, metal ions in the conductive structure 12 are driven by the electrons and thus diffuse in a direction from the cathode to the anode. This phenomenon is known as electro migration (EM). With the improvement of the integration level of the chips, the dimension of the components becomes smaller, and the size of the conductive structure 12 is also reduced. Generally, the reduction of the size of the conductive structure 12 may lead to an increase in the current density in the conductive structure 12, and as a result, the probability for the EM phenomenon to emerge in the conductive structure 12 may also be increased.

Referring to FIG. 1, the cap layer 13 is used to suppress the emergence of the EM phenomenon in the conductive structure 12. The cap layer 13 is made of AlN. Moreover, the AlN-made cap layer 13 may also serve as an etch stop layer during the fabrication process of the interconnection structure.

However, the fabrication process for the AlN-made cap layer 13 often faces two problems. First, the strength of the connection between the AlN-made cap layer 13 and the conductive structure 12 may be relatively weak, and thus the ability of the AlN-made cap layer 13 to suppress the EM phenomenon may be weak. Compared to that of a cap layer containing Co, the ability of the AlN-made cap layer 13 in suppressing the EM phenomenon may often be one to two orders of magnitude weaker. Moreover, the dielectric layer 11 may have a relatively low density and may contain a plurality of pores. Therefore, during the process to form the AlN-made cap layer 13, the Al atoms may easily penetrate through and enter the pores of the dielectric layer 11. Therefore, the electrical isolation properties of the dielectric layer 11 may be reduced, and the possibility for current leaking or time dependent dielectric breakdown (TDDB) to take place may be increased.

Figure 7:
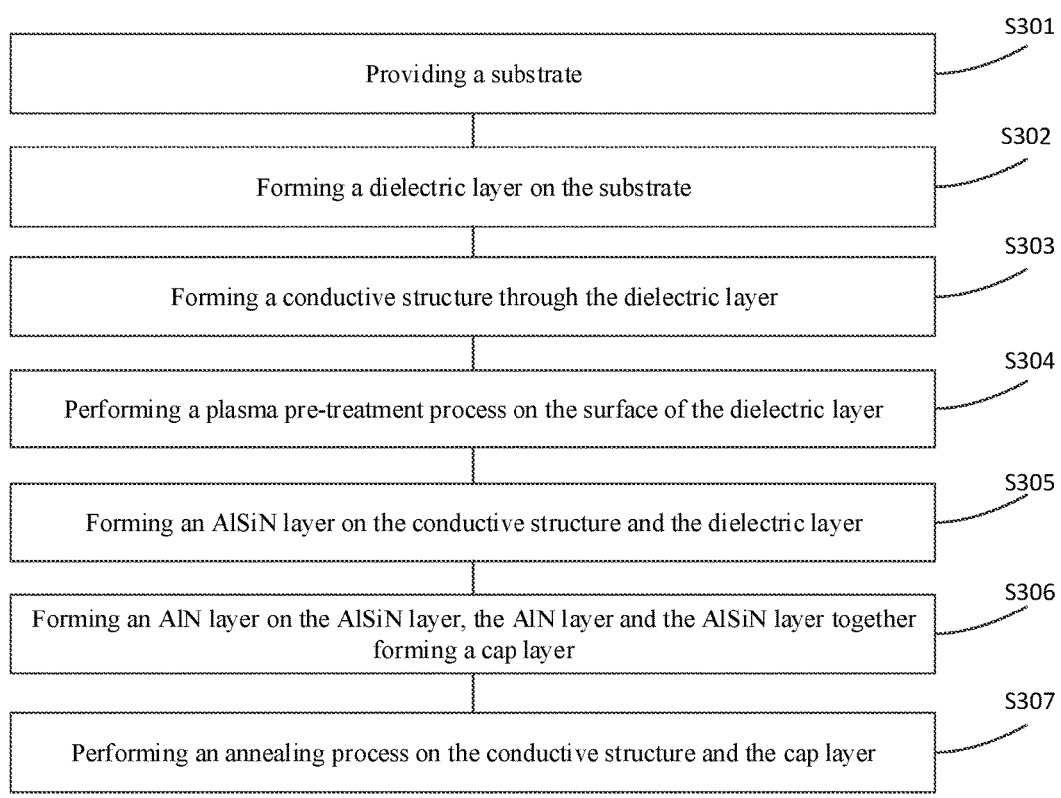
FIG. 7 illustrates a flowchart of an exemplary method for fabricating an interconnection structure consistent with various disclosed embodiments in the present disclosure.

The present disclosure provides a method for fabricating an interconnection structure. FIG. 7 illustrates a flowchart of an exemplary method for fabricating an interconnection structure consistent with various disclosed embodiments in the present disclosure.

Figure 2:
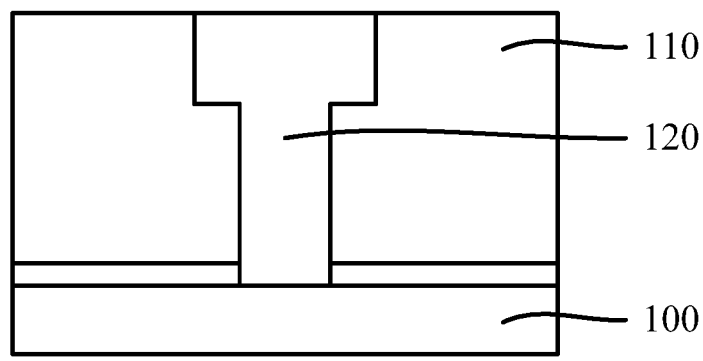
FIGS. 2-6 illustrate schematic views of semiconductor structures at certain stages for fabricating an exemplary interconnection structure consistent with various disclosed embodiments in the present disclosure.

Referring to FIG. 7, a substrate may be provided (S301). FIG. 2 shows a schematic cross-section view of a semiconductor structure consistent with various embodiments of the present disclosure.

Referring to FIG. 2, a substrate 100 may be provided. The substrate 100 may be used to provide a basis for process operation.

In one embodiment, the substrate 100 is made of single-crystalline silicon. In other embodiments, the substrate may be made of polycrystalline silicon, amorphous silicon, germanium, SiGe, GaAs, or any other appropriate semiconductor material. Moreover, the substrate may also be a structure with an epitaxial layer or a structure with silicon formed on an epitaxial layer.

In one embodiment, the substrate 100 is a planar substrate. In other embodiments, the substrate may include a plurality of semiconductor structures, such as fin structures, etc. formed on the substrate.

Further, returning to FIG. 7, a dielectric layer may be formed on the substrate (S302). As shown in FIG. 2, a dielectric layer 110 may be formed on the substrate 100. The dielectric layer 110 may be used to electrically isolate neighboring semiconductor structures. In one embodiment, the dielectric layer 110 is an interlayer dielectric layer used to electrically isolate neighboring device layers.

In one embodiment, the dielectric layer 110 may be made of an ultra-low-k dielectric material (i.e., a material with a dielectric constant less than 2.5), such as doped $SiO_2$, organic polymers, porous materials, etc. Therefore, the dielectric layer 110 may contain a plurality of pores, and thus may have a relatively low density.

In other embodiments, the dielectric layer may be made of one or more from $SiO_x$, $SiN_x$, SiON, low-k dielectric materials (i.e., materials with a dielectric constant greater than or equal to 2.5, but less than 3.9), and ultra-low-k dielectric materials.

Further, the dielectric layer 110 may be formed by various methods including chemical vapor deposition (CVD), physical vapor deposition (PVD), atomic layer deposition (ALD), furnace tube deposition, etc.

Returning to FIG. 7, further, a conductive structure may be formed in the dielectric layer (S303). Referring to FIG. 2, a conductive structure 120 may be formed in the dielectric layer 110.

The conductive structure 120 may be used to make a connection from a semiconductor structure formed in the substrate 100 to an external circuit. In one embodiment, the conductive structure 120 may penetrate through the dielectric layer 110 and directly connect to the substrate 100. Therefore, the conductive structure 120 may be used to make the connection between the substrate 100 and the external circuit. In other embodiments, the conductive structure 120 may be formed in the dielectric layer 110 and may not be connected to the substrate 100.

In one embodiment, the interconnection structure may be a dual Damascene structure. Therefore, the conductive structure 120 may include a plug (not shown) formed on the substrate 100 and an interconnection (not shown) formed on the plug. In other embodiments, the interconnection structure may be a single Damascene structure or any other form of interconnection structure. Moreover, the conductive structure 120 may be made of copper.

Specifically, the process to form the conductive structure 120 may include the following steps. First, an opening may be formed in the dielectric layer 110. The opening may include a trench and a through hole. The trench may be formed through a top portion of the dielectric layer 110. That is, the trench may be formed by removing a top portion of the dielectric layer 110. The through hole may be formed on the bottom of the trench and may penetrate through the remaining portion of the dielectric layer 110. Further, the conductive structure 120 may be formed in the opening.

The process to form the conductive structure 120 in the opening may further include forming a conductive layer to cover the dielectric layer 110 by filling the opening with a conductive material, and performing a planarization process on the conductive layer to remove the portion of the conductive layer formed above the dielectric layer 110, and thus form the conductive structure 120.

In one embodiment, after forming the conductive structure 120, the fabrication method may also include removing the oxide formed on the surface of the conductive structure 120 by using a nitrogen-containing gas to treat the conductive structure 120. Specifically, the nitrogen-containing gas may include at least one of $NH_3$ and $N_2$. By using the nitrogen-containing gas to treat the conductive structure 120, $CuO_x$ formed on the surface of the conductive structure 120 may be removed.

Figure 3:
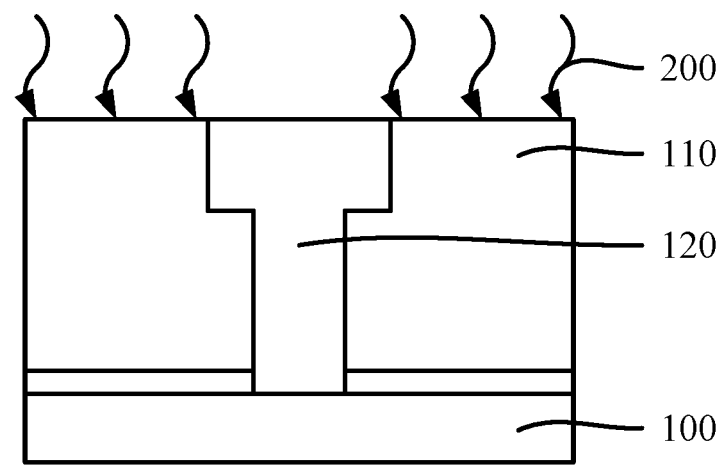

Further, returning to FIG. 7, a plasma pre-treatment process may be performed on the surface of the dielectric layer (S304). FIG. 3 shows a schematic diagram of performing a plasma pre-treatment process according to various embodiments of the present disclosure.

Referring to FIG. 3, after forming the conducive structure 120 and prior to forming a cap layer, the fabrication method may further include performing a plasma pre-treatment process 200 on the surface of the dielectric layer 110.

In one embodiment, the dielectric layer 110 may be made of an ultra-low-k dielectric material with a relatively low density. The plasma pre-treatment process 200 may be used to repair the defects on the surface of the dielectric layer 110 and improve the density of the dielectric layer 110. Therefore, during a subsequent process to form a cap layer, diffusion of the material of the cap layer into the dielectric layer 110 may be suppressed, and thus the emergence of current leaking and the TDDB phenomenon may be reduced.

In one embodiment, trisilylamine ($Si_3H_9N$, TSA) may be used in the plasma pre-treatment process 200 to treat the surface of the dielectric layer 110. Under the action of the plasma, TSA may be dissociated into Si atoms and N atoms. Specifically, the Si atoms and the N atoms in TSA may locally react with the dielectric layer 110 and form chemical bonds, i.e. Si—O—SiN bonds, to repair the defects at the surface of the dielectric layer 110 and improve the density of the dielectric layer 110. As such, diffusion of the material of the subsequently-formed cap layer may be suppressed, the electrical isolation performance of the dielectric layer 110 in the formed interconnection structure may be improved, and the emergence of current leaking and the TDDB phenomenon may be reduced. Therefore, the reliability of the formed interconnection structure may be improved.

In one embodiment, TSA may be used to treat the surface of the dielectric layer 110 during the plasma pre-treatment process 200. The process parameters used in the plasma pre-treatment process 200 may include a flow rate of the TSA-containing process gas in a range of approximately 150 sccm to 300 sccm, an RF power in a range of approximately 250 W and 750 W, a process temperature in a range of approximately 250° C. to 350° C., a process gas pressure in a range of approximately 3 Torr to 10 Torr, and a pre-treatment time in a range of approximately 15 s to 45 s.

In a subsequent process, a cap layer may be formed on the conductive structure and the dielectric layer. The cap layer may be used to improve the connection strength between the conductive structure 120 and the dielectric layer 110, and thus suppress the EM in the formed interconnection structure. As such, the reliability of the formed interconnection structure may be improved.

In one embodiment, the cap layer may have a multi-layer structure. For example, the cap layer may include an AlSiN layer and an AlN layer formed on the AlSiN layer. In other embodiments, the cap layer may have a single layer structure. For example, the cap layer may have a signal layer structure made of AlSiN. In the following, fabricating a cap layer including an AlSiN layer and an AlN layer will be described as an example to illustrate the various fabrication methods according to the present disclosure.

Figure 4:
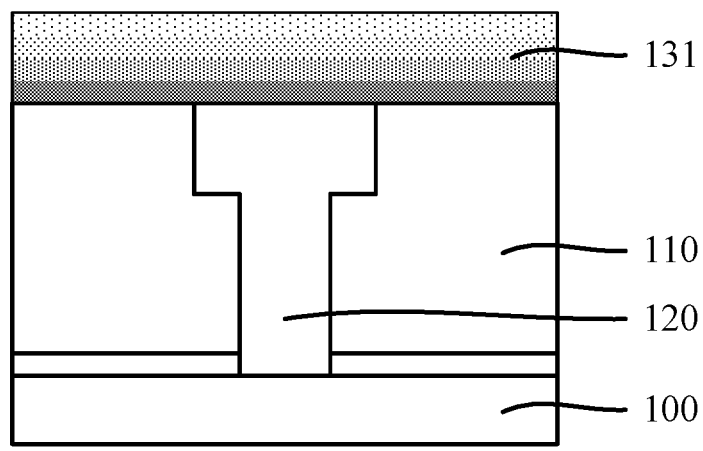

Referring to FIG. 7, an AlSiN layer may be formed on the conductive structure and the dielectric layer (S305). FIG. 4 shows a schematic view of a corresponding semiconductor structure.

Referring to FIG. 4, an AlSiN layer 131 may be formed on the conductive structure 120 and the dielectric layer 110. In one embodiment, the AlSiN layer 131 may be formed by an ALD process. Specifically, films formed by an ALD process may demonstrate desired step coverage. Therefore, forming the AlSiN layer 131 through an ALD process may be able to efficiently improve the morphology of the formed cap layer and thus conducive to increasing the process window and improve the product yield.

In one embodiment, the process to form the AlSiN layer 131 may include performing at least one deposition of a Si-doped material. The process to deposit the Si-doped material may include absorbing an aluminum-containing atomic layer, absorbing a silicon-containing atomic layer on the aluminum-containing atomic layer, and then performing a nitrogen treatment process on the aluminum-containing atomic layer and the silicon-containing atomic layer.

The process to absorb the aluminum-containing atomic layer may include introducing an aluminum-containing reaction gas pulse for deposition, and then removing the residual of the aluminum-containing reaction gas through purging. In one embodiment, the aluminum-containing gas may be trimethylaluminum (TMA), i.e. $AlCH_3$.

During the process to introduce the aluminum-containing reaction gas pulse, the flow rate of the aluminum-containing reaction gas may be in a range of approximately 50 sccm to 150 sccm, the gas pressure may be in a range of approximately 5 Torr to 15 Torr, the process temperature may be in a range of approximately 250° C. to 350° C., and the process time may be in a range of approximately 10 ms to 50 ms.

Further, the process to remove the residual of the aluminum-containing reaction gas may include introducing an inert gas to purge the residual of the aluminum-containing reaction gas. In one embodiment, the inert gas may be Ar, and during the process to purge the residual of the aluminum-containing reaction gas, the flow rate of the inert gas may be in a range of approximately 50 sccm to 150 sccm, the gas pressure may be in a range of approximately 3 Torr to 5 Torr, and the process time may be in a range of approximately 50 ms to 150 ms.

The process to absorb the silicon-containing atomic layer on the aluminum-containing atomic layer may include introducing a silicon-containing reaction gas pulse for deposition, and then removing the residual of the silicon-containing gas through purging. In one embodiment, the silicon-containing gas may include $SiH_4$.

During the process to introduce the silicon-containing reaction gas pulse, the flow rate of the silicon-containing reaction gas may be in a range of approximately 50 sccm to 150 sccm, the gas pressure may be in a range of approximately 5 Torr to 15 Torr, the process temperature may be in a range of approximately 250° C. to 350° C., and the process time may be in a range of approximately 10 ms to 50 ms.

Further, the process to remove the residual of the silicon-containing reaction gas may include introducing an inert gas to purge the residual of the silicon-containing reaction gas. In one embodiment, the inert gas may be Ar, and during the process to purge the residual of the silicon-containing reaction gas, the flow rate of the inert gas may be in a range of approximately 50 sccm to 150 sccm, the gas pressure may be in a range of approximately 3 Torr to 5 Torr, and the process time may be in a range of approximately 50 ms to 150 ms.

Further, the nitrogen treatment performed on the aluminum-containing atomic layer and the silicon-containing atomic layer may include using a nitrogen-containing reaction gas to treat the aluminum-containing atomic layer and the silicon-containing atomic layer. In one embodiment, the nitrogen-containing reaction gas may include at least one of $NH_3$ and $N_2$.

For example, during the process to perform plasma nitrogen treatment on the aluminum-containing atomic layer and the silicon-containing atomic layer using the nitrogen-containing reaction gas, the flow rate of the nitrogen may be in a range of approximately 100 sccm to 200 sccm, the gas pressure may be in a range of approximately 5 Torr to 15 Torr, a process temperature may be in a range of approximately 250° C. to 350° C., and a process time may be in a range of approximately 50 ms to 150 ms.

During the process to form the AlSiN layer 131, the doping concentration of silicon in the AlSiN layer 131 may not be too high or too low. When the doping concentration of silicon in the AlSiN layer 131 is too low, the Si atoms that can react with the material of the dielectric layer 110 and form chemical bonds may not be sufficient so that the connection strength between the dielectric layer 110 and the conductive structure 120 may not be effectively improved. Therefore, such a low doping concentration of silicon in the AlSiN layer 131 may not be conducive to improving the reliability of the formed interconnection structure. However, when the doping concentration of silicon in the AlSiN layer 131 is too high, the resistance of the formed interconnection structure may be too large, and thus the electrical performance of the formed interconnection structure may be affected. In one embodiment, during the process to form the AlSiN layer 131, by atomic percentage, the doping concentration of silicon in the AlSiN layer 131 may be in a range of approximately 10% to 20%.

In one embodiment, the AlSiN layer 131 may be formed by a process including multiple times of deposition of a silicon-doped material. That is, the absorption of an aluminum-containing atomic layer, the absorption of a silicon-containing atomic layer, and the nitrogen treatment process may be repeatedly executed until the thickness of the formed AlSiN layer 131 reaches a preset value.

The doping concentration of silicon in the AlSiN layer 131 may affect the resistance of the subsequently-formed cap layer. In addition, Si atoms may be able to combine with Cu atoms and form chemical bonds only when the Si atoms are on the surface of the conductive structure 120. Therefore, in one embodiment, during the process to form the AlSiN layer 131, in order to reduce the resistance of the subsequently-formed cap layer, the doping concentration of silicon in the AlSiN layer 131 may gradually decrease along the direction away from the conductive structure 120. As such, the influence on the electrical performance of the interconnection structure due to the formation of the silicon-doped cap layer may be reduced, and thus the performance and the reliability of the formed interconnection structure may be improved.

Accordingly, the multiple times of deposition of the silicon-doped material may include a gradually reduced flow rate of $SiH_4$, or a gradually reduced process time for introducing $SiH_4$.

Moreover, during the process to deposit the silicon-doped material for multiple times, the reduction of the flow rate of $SiH_4$ in each step may not be too large or too small. For example, when the reduction of the flow rate of $SiH_4$ in each step is too large, the doping concentration of silicon in the formed AlSiN layer 131 may become too small such that the connection strength between the dielectric layer 110 and the conductive structure 120 may not be effectively improved. Therefore, such a large reduction of the flow rate of $SiH_4$ in each step may not be conducive to improving the reliability of the formed interconnection structure. However, when the reduction of the flow rate of $SiH_4$ in each step is too small, the doping concentration of silicon in the formed AlSiN layer 131 may be too large such that the resistance of the formed interconnection structure may be too large, and thus the electrical performance of the formed interconnection structure may be affected. In one embodiment, from the first deposition of the silicon-doped material to the last deposition of the silicon-doped material, the flow rate of $SiH_4$ may be gradually reduced from an initial flow rate to approximately 25% of the initial flow rate. That is, during the last deposition of the silicon-doped material, the flow rate of $SiH_4$ may be approximately 25% of the initial flow rate.

Further, during the process to deposit the silicon-doped material for multiple times, the reduction of the process time to introduce $SiH_4$ in each step may not be too large or too small. For example, when the reduction of the process time to introduce $SiH_4$ in each step is too large, the doping concentration of silicon in the formed AlSiN layer 131 may become too small such that the connection strength between the dielectric layer 110 and the conductive structure 120 may not be effectively improved. Therefore, such a large reduction of the process time to introduce $SiH_4$ in each step may not be conducive to improving the reliability of the formed interconnection structure. However, when the reduction of the process time to introduce $SiH_4$ in each step is too small, the doping concentration of silicon in the formed AlSiN layer 131 may be too large such that the resistance of the formed interconnection structure may be too large, and thus the electrical performance of the formed interconnection structure may be affected. In one embodiment, from the first deposition of the silicon-doped material to the last deposition of the silicon-doped material, the process time to introduce $SiH_4$ may be gradually reduced from an initial process time to approximately 25% of the initial process time. That is, during the last deposition of the silicon-doped material, the process time to introduce $SiH_4$ may be approximately 25% of the initial process time.

Moreover, the thickness of the formed AlSiN layer 131 may not be too large or too small. When the thickness of the AlSiN layer 131 is too small, the connection strength between the conductive structure 120 and the dielectric layer 110 may not be effectively improved, which may further affect the improvement of the reliability of the interconnection structure. However, when the thickness of the AlSiN layer 131 is too large, the overly large thickness of the AlSiN layer 131 may lead to problems such as material waste and increased process challenges. In addition, an overly large total thickness of the Si-doped cap layer 131 may also lead to an overly large resistance for the subsequently-formed cap layer, and further affect the electrical performance of the formed interconnection structure. In one embodiment, during the process to form the AlSiN layer 131, the thickness of the AlSiN layer 131 may be in a range of approximately 20 Å to 50 Å.

Figure 5:
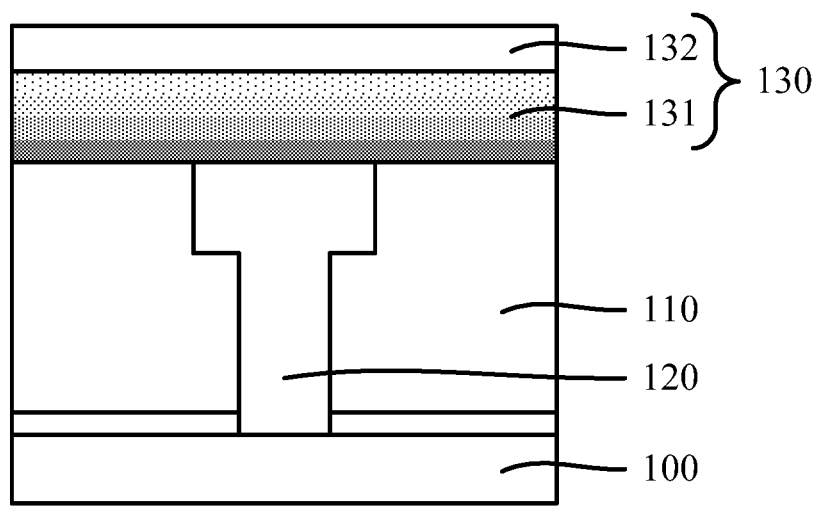

Further, returning to FIG. 7, after forming the AlSiN layer, an AlN layer may be formed on the AlSiN layer, and the AlN layer together with the AlSiN layer may form a cap layer (S306). FIG. 5 shows a schematic cross-section view of a corresponding semiconductor structure.

Referring to FIG. 5, an AlN layer 132 may be formed on the top of the AlSiN layer 131. The AlN layer 132 and the AlSiN layer 131 may together form a cap layer 130.

In one embodiment, the AlN layer 132 may be formed by an ALD process. Specifically, films formed by an ALD process may demonstrate desired step coverage. Therefore, forming the AlN layer 132 through an ALD process may be able to efficiently improve the morphology of the formed cap layer 130 and thus conducive to increasing the process window and improve the product yield.

In one embodiment, the process to form the AlN layer 132 may include performing at least one deposition. The deposition process may include absorbing an aluminum-containing atomic layer and then performing a nitrogen treatment process on the aluminum-containing atomic layer.

The process to absorb the aluminum-containing atomic layer may include introducing an aluminum-containing reaction gas pulse for deposition, and removing the residual of the aluminum-containing reaction gas through purging. In one embodiment, the aluminum-containing gas may be $AlCH_3$ (i.e. TMA).

During the process to introduce the aluminum-containing reaction gas pulse, the flow rate of the aluminum-containing reaction gas may be in a range of approximately 50 sccm to 150 sccm, the gas pressure may be in a range of approximately 5 Torr to 15 Torr, the process temperature may be in a range of approximately 250° C. to 350° C., and the process time may be in a range of approximately 10 ms to 50 ms.

Further, the process to remove the residual of the aluminum-containing reaction gas may include introducing an inert gas to purge the residual of the aluminum-containing reaction gas. In one embodiment, the inert gas may be Ar, and during the process to purge the residual of the aluminum-containing reaction gas, the flow rate of the inert gas may be in a range of approximately 50 sccm to 150 sccm, the gas pressure may be in a range of approximately 3 Torr to 5 Torr, and the process time may be in a range of approximately 50 ms to 150 ms.

In one embodiment, by forming a Si-doped cap layer 130, the Si atoms in the cap layer 130 may react with the material of the conductive structure 120 and form chemical bonds. Therefore, the connection strength between the cap layer 130 and the conductive structure 120 may be improved, which may be conducive to suppressing the EM in the formed interconnection structure, and thus may help improve the reliability of the formed interconnection structure.

In one embodiment, the cap layer 130 may be made of a material including Si-doped AlN, and the conductive structure 120 may be made of copper. The Si atoms doped in the cap layer 130 may be able to react with the Al atoms and the N atoms in the cap layer 130 as well as the Cu atoms in the conductive structure 120, and further form chemical bonds, i.e. CuSi—AlN bonds. Therefore, the connection strength between the cap layer 130 and the conductive structure 120 may be improved. As such, the EM in the formed interconnection structure may be suppressed and the reliability of the formed interconnection structure may be improved.

Moreover, the nitrogen treatment performed on the aluminum-containing atomic layer may include using a nitrogen-containing reaction gas to treat the aluminum-containing atomic layer. In one embodiment, the nitrogen-containing reaction gas may include at least one of $NH_3$ and $N_2$.

For example, during the process to perform plasma nitrogen treatment on the aluminum-containing atomic layer using the nitrogen-containing reaction gas, the flow rate of the nitrogen may be in a range of approximately 100 sccm to 200 sccm, the gas pressure may be in a range of approximately 5 Torr to 15 Torr, a process temperature may be in a range of approximately 250° C. to 350° C., and a process time may be in a range of approximately 50 ms to 150 ms.

In one embodiment, the AlN layer 132 may be formed by a process including multiple times of material deposition. That is, the absorption of an aluminum-containing atomic layer and the nitrogen treatment process may be repeatedly executed until the thickness of the formed AlN layer 132 reaches a preset value.

Moreover, the thickness of the formed AlN layer 132 may not be too large or too small. When the thickness of the AlN layer 132 is too small, the connection strength between the conductive structure 120 and the dielectric layer 110 may not be effectively improved, which may further affect the improvement of the reliability of the interconnection structure. However, when the thickness of the AlN layer 132 is too large, the overly large thickness of the AlN layer 132 may lead to problems such as material waste and increased process challenges. In one embodiment, during the process to form the AlN layer 132, the thickness oft AlN layer 132 may be in a range of approximately 5 Å to 25 Å.

Further, during the process to form the cap layer 130, including the AlSiN layer 131 and the AlN layer 132, the ratio between the thickness of the AlSiN layer 131 and the thickness of the AlN layer 132 may not be too large or too small. When the ratio between the thickness of the AlSiN layer 131 and the thickness of the AlN layer 132 is too small, the Si doping concentration in the cap layer 130 may be too small to effectively improve the connection strength between the conductive structure 120 and the dielectric layer 110, and thus may affect the reliability of the interconnection structure. When the ratio between the thickness of the AlSiN layer 131 and the thickness of the AlN layer 132 is too large, the large ratio may lead to material waste and increased process challenges. In addition, the overly large doping concentration of Si in the cap layer 130 may also cause the resistance of the formed cap layer 130 to be too large, and thus the electrical performance of the formed interconnection structure may be affected. In one embodiment, during the process to form the cap layer 130, the ratio between the thickness of the AlSiN layer 131 and the thickness of the AlN layer 132 may be in a range from approximately 3:1 to approximately 2:1.

Figure 6:
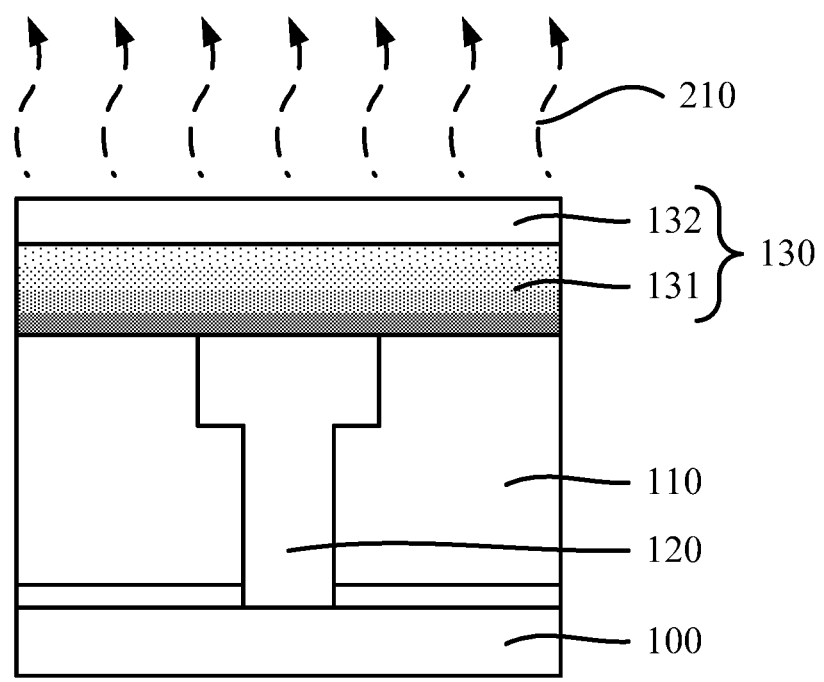

Further, returning to FIG. 7, after forming the cap layer including the AlSiN layer and the AlN, an annealing process may be performed on the conductive structure and the cap layer (S307). FIG. 6 shows a schematic diagram of an annealing process according to various embodiments of the present disclosure.

Referring to FIG. 6, after forming the cap layer 130, an annealing process 210 may be performed on the conductive structure 210 and the cap layer 130. The annealing process 210 may be used to form an interconnection structure. In addition, the annealing process 210 may also be used to enable the diffusion of the Si atoms in the cap layer 130, and thus allow the Si atoms further to react with the atoms in the material of the conductive structure 120 and form chemical bonds. As such, the emergence of the EM phenomenon in the formed interconnection structure may be suppressed, and the reliability of the formed interconnection structure may be improved.

In one embodiment, the conductive structure 120 is made of copper, the cap layer 130 is made of a material including Si-doped AlN. The annealing process 210 may enable the diffusion of the Si atoms in the cap layer 130 diffuse and further allow the Si atoms to react with the Al atoms and the N atoms in the cap layer 130 as well as the Cu atoms in the conductive structure 120 and form chemical bonds, i.e. CuSi—AlN bonds. As such, the connection strength between the cap layer 130 and the conductive structure 120 may be improved. Therefore, performing the annealing process may help improving the connection strength between the cap layer 130 and the conductive structure 120, suppressing the EM in the formed interconnection structure, and also improving the reliability of the formed interconnection structure.

In one embodiment, during the annealing process 210, the anneal temperature may not be too high or too low, and the anneal time may not be too long or too short.

When the anneal temperature is too high, or the anneal time is too long, the annealing process may cause unnecessary process risk, and increase the possibility to damage other semiconductor structures formed on the substrate 100. However, when the anneal temperature is too low or the anneal time is too short, forming chemical bonds through the reaction of the Si atoms, the Cu atoms, the Al atoms, and the N atoms may be affected, which may be detrimental to suppressing EM in the formed interconnection structure, and thus may not be conducive to improving the reliability of the formed interconnection structure. In one embodiment, during the annealing process 210, the anneal temperature may be in a range of approximately 250° C. to 350° C., and the anneal time may be in a range of approximately 2 minutes to 5 minutes.

In one embodiment, after performing the annealing process 210, the fabricating method may also include forming a dielectric cap layer on the cap layer 130. The dielectric cap layer may be formed by any appropriate method according to current technology.

The present disclosure also provides an interconnection structure consistent with various embodiments. FIG. 6 illustrates an exemplary interconnection structure according to various embodiments of the present disclosure.

Referring to FIG. 6, the interconnection structure may include a substrate 100, a dielectric layer 110 formed on the substrate 100, a conductive structure 120 formed in the dielectric layer 110, a cap layer 130 formed on the conductive structure 120 and the dielectric layer 110. The cap layer 130 may be a Si-doped cap layer.

In one embodiment, the substrate 100 is made of single-crystalline silicon. In other embodiments, the substrate may also be made of polycrystalline silicon, amorphous silicon, germanium, SiGe, GaAs, or any other appropriate semiconductor material. The substrate may also be a structure with an epitaxial layer or a structure with silicon formed on an epitaxial layer.

In one embodiment, the substrate 100 is a planar substrate. In other embodiments, the substrate may also include a plurality of semiconductor structures, such as fin structures, etc. formed on the substrate.

In one embodiment, the dielectric layer 110 may be made of an ultra-low-k dielectric material (i.e., a material with a dielectric constant less than 2.5), such as doped $SiO_2$, organic polymers, porous materials, etc. Therefore, the dielectric layer 110 may contain a plurality of pores, and thus may have a relatively low density.

In other embodiments, the dielectric layer may also be made of one or more from $SiO_x$, $SiN_x$, SiON, low-k dielectric materials (i.e., materials with a dielectric constant greater than or equal to 2.5, but less than 3.9), and ultra-low-k dielectric materials.

The conductive structure 120 may be used to make a connection from a semiconductor structure formed in the substrate 100 to external circuit. In one embodiment, the conductive structure 120 may penetrate through the dielectric layer 110 and directly connect to the substrate 100. Therefore, the conductive structure 120 may be used to make the connection between the substrate 100 and the external circuit. In other embodiments, the conductive structure 120 may be formed in the dielectric layer 110 and may not be connected to the substrate 100.

In one embodiment, the interconnection structure may be a dual Damascene structure. Therefore, the conductive structure 120 may include a plug (not shown) formed on the substrate 100 and an interconnection (not shown) formed on the plug. In other embodiments, the interconnection structure may also be a single Damascene structure or any other form of interconnection structure. Moreover, the conductive structure 120 may be made of copper.

The cap layer 130 may be used to improve the connection strength between the conductive structure 120 and the dielectric layer 110, and thus suppress the EM in the interconnection structure and improve the reliability of the interconnection structure.

The cap layer 130 may be a Si-doped cap layer. Si atoms in the cap layer 130 may react with the material of the conductive structure 120 and form chemical bonds. Therefore, the connection strength between the cap layer 130 and the conductive structure 120 may be improved, which may be conducive to suppressing the EM in the interconnection structure and improving the reliability of the interconnection structure.

In one embodiment, the cap layer 130 may be made of a material including Si-doped AlN, and the conductive structure 120 may be made of copper. The Si atoms doped in the cap layer 130 may be able to react with the Al atoms and the N atoms in the cap layer 130 as well as the Cu atoms in the conductive structure 120, and further form chemical bonds, i.e. CuSi—AlN bonds. Therefore, the connection strength between the cap layer 130 and the conductive structure 120 may be improved. As such, the EM in the formed interconnection structure may be suppressed and the reliability of the formed interconnection structure may be improved.

In one embodiment, the cap layer 130 may have a bi-layer structure including an AlSiN layer 131 and an AlN layer 132 formed on the AlSiN layer 131. In other embodiments, the cap layer may also have a single layer structure. For example, the cap layer 130 may have a single layer structure made of AlSiN.

Further, the thickness of the formed AlSiN layer 131 may not be too large or too small. When the thickness of the AlSiN layer 131 is too small, the connection strength between the conductive structure 120 and the dielectric layer 110 may not be effectively improved, which may further affect the improvement of the reliability of the interconnection structure. However, when the thickness of the AlSiN layer 131 is too large, the overly large thickness of the AlSiN layer 131 may lead to problems such as material waste and increased process challenges. In addition, an overly large total thickness of the Si-doped cap layer 131 may also lead to an overly large resistance for the subsequently-formed cap layer, and further affect the electrical performance of the formed interconnection structure. In one embodiment, during the process to form the AlSiN layer 131, the thickness of the AlSiN layer 131 may be in a range of approximately 20 Å to 50 Å.

Moreover, the doping concentration of silicon in the AlSiN layer 131 may not be too high or too low. When the doping concentration of silicon in the AlSiN layer 131 is too low, the Si atoms that can react with the material of the dielectric layer 110 and form chemical bonds may not be sufficient so that the connection strength between the dielectric layer 110 and the conductive structure 120 may not be effectively improved. Therefore, such a low doping concentration of silicon in the AlSiN layer 131 may not be conducive to improving the reliability of the formed interconnection structure. However, when the doping concentration of silicon in the AlSiN layer 131 is too high, the resistance of the formed interconnection structure may be too large, and thus the electrical performance of the formed interconnection structure may be affected. In one embodiment, during the process to form the AlSiN layer 131, by atomic percentage, the doping concentration of silicon in the AlSiN layer 131 may be in a range of approximately 10% to 20%.

Moreover, the thickness of the formed AlN layer 132 may not be too large or too small. When the thickness of the AlN layer 132 is too small, the connection strength between the conductive structure 120 and the dielectric layer 110 may not be effectively improved, which may further affect the improvement of the reliability of the interconnection structure. However, when the thickness of the AlN layer 132 is too large, the overly large thickness of the AlN layer 132 may lead to problems such as material waste and increased process challenges. In one embodiment, during the process to form the AlN layer 132, the thickness of t AlN layer 132 may be in a range of approximately 5 Å to 25 Å.

Further, during the process to form the cap layer 130, including the AlSiN layer 131 and the AlN layer 132, the ratio between the thickness of the AlSiN layer 131 and the thickness of the AlN layer 132 may not be too large or too small. When the ratio between the thickness of the AlSiN layer 131 and the thickness of the AlN layer 132 is too small, the Si doping concentration in the cap layer 130 may be too small to effectively improve the connection strength between the conductive structure 120 and the dielectric layer 110, and thus may affect the reliability of the interconnection structure. When the ratio between the thickness of the AlSiN layer 131 and the thickness of the AlN layer 132 is too large, the large ratio may lead to material waste and increased process challenges. In addition, the overly large doping concentration of Si in the cap layer 130 may also cause the resistance of the formed cap layer 130 to be too large, and thus the electrical performance of the formed interconnection structure may be affected. In one embodiment, during the process to form the cap layer 130, the ratio between the thickness of the AlSiN layer 131 and the thickness of the AlN layer 132 may be in a range from approximately 3:1 to approximately 2:1.

In one embodiment, the interconnection structure may also include a dielectric cap layer formed on the cap layer 130. The dielectric cap layer may be formed by any appropriate method according to current technology.

Compared to existing fabrication methods and interconnection structures, the disclosed fabrication methods and interconnection structures may demonstrate several advantages.

For example, according to the disclosed interconnection structures and fabrication methods, the cap layer is a Si-doped cap layer. Si atoms in the cap layer may react with the material of the conductive structure and further form chemical bonds. Therefore, the connection strength between the cap layer and the conductive structure may be improved, which may be conducive to suppressing the EM in the interconnection structure and improving the reliability of the interconnection structure.

Further, according to the disclosed interconnection structures and fabrication methods, the conductive structure 120 is made of copper and the cap layer 130 is made of a material including Si-doped AlN. The Si atoms, the Al atoms, and the N atoms in the cap layer and the Cu atoms in the conductive structure may react with each other and form CuSi—AlN bonds. As such, the connection strength between the cap layer and the conductive structure may be improved, which may be conducive to improving the connection strength between the cap layer 130 and the conductive structure 120, suppressing the EM in the formed interconnection structure, and improving the reliability of the formed interconnection structure.

Further, according to the disclosed interconnection structures and fabrication methods, the doping concentration of silicon in the AlSiN layer may gradually decrease along the direction away from the conductive structure. As such, the influence on the electrical performance of the interconnection structure due to the formation of the silicon-doped cap layer may be reduced, and thus the performance and the reliability of the formed interconnection structure may be improved.

Moreover, according to the disclosed interconnection structures and fabrication methods, the dielectric layer may be made of an ultra-low-k material, and after forming the conductive structure and prior to forming the cap layer, a plasma pre-treatment process using TSA ($Si_3H_9N$) may be performed on the surface of the dielectric layer. Further, TSA may locally react with the dielectric layer and form chemical bonds, i.e. Si—O—SiN bonds, to repair the defects at the surface of the dielectric layer and improve the density of the dielectric layer. As such, diffusion of the material of the subsequently-formed cap layer may be suppressed, the electrical isolation properties of the dielectric layer in the formed interconnection structure may be improved, and the emergence of current leaking and the TDDB phenomenon may be reduced. Therefore, the reliability of the formed interconnection structure may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an interconnection structure, comprising:
    providing a substrate;
    forming a dielectric layer on the substrate;
    forming a conductive structure in the dielectric layer;
    forming a cap layer doped with silicon on the conductive structure and the dielectric layer, wherein the cap layer has a bi-layer structure; and
    performing an annealing process on the conductive structure and the cap layer, wherein along a direction away from the conductive structure, a doping concentration of silicon in the cap layer gradually decreases.

2. The method for fabricating the interconnection structure according to claim 1, wherein:
    the cap layer is made of a material including silicon-doped AlN.

3. The method for fabricating the interconnection structure according to claim 1, wherein:
    the cap layer is formed by an atomic layer deposition.

4. The method for fabricating the interconnection structure according to claim 3, wherein forming the cap layer further includes:
    forming an AlSiN layer on the conductive structure and the dielectric layer; and
    forming an AlN layer on the AlSiN layer.

5. The method for fabricating the interconnection structure according to claim 4, wherein:
    a ratio between a thickness of the AlSiN layer and a thickness of the AlN layer is in a range of 3:1 to 2:1.

6. The method for fabricating the interconnection structure according to claim 1, wherein:
    an atomic percentage of the silicon doped in the cap layer is in a range of approximately 10% to approximately 20%.

7. The method for fabricating the interconnection structure according to claim 1, after forming the conductive structure and prior to forming the cap layer, further including:
    performing a plasma pre-treatment process on a surface of the dielectric layer.

8. The method for fabricating the interconnection structure according to claim 1, wherein performing the plasma pre-treatment process includes:
    using plasma of trisilylamine to treat the surface of the dielectric layer.

9. The method for fabricating the interconnection structure according to claim 1, wherein:
    the dielectric layer is made of an ultra-low-k dielectric material with a dielectric constant lower than 2.5; and
    the conductive structure is made of Cu.

10. A method for fabricating an interconnection structure, comprising:
    providing a substrate;
    forming a dielectric layer on the substrate;
    forming a conductive structure in the dielectric layer;
    forming a cap layer doped with silicon on the conductive structure and the dielectric layer;
    controlling a doping concentration of the silicon in the cap layer to gradually decrease along a direction away from the conductive structure; and
    performing an annealing process on the conductive structure and the cap.

11. The method for fabricating the interconnection structure according to claim 10, wherein:
    forming the cap layer further includes at least one time of deposition of a silicon-doped material;
    each time of the deposition of the silicon-doped material includes absorbing an Al-containing atomic layer, absorbing a Si-containing atomic layer on the Al-containing atomic layer, and performing a nitrogen treatment process on the Al-containing atomic layer and the Si-containing atomic layer; and absorbing the Si-containing atomic layer on the Al-containing atomic layer includes introducing a Si-containing reaction gas including $SiH_4$, and removing remaining Si-containing reaction gas by purging.

12. The method for fabricating the interconnection structure according to claim 11, wherein:
    deposition of the silicon-doped material is performed multiple times; and
    a flow rate of $SiH_4$ gradually decreases during the multiple times of deposition of the silicon-doped material.

13. The method for fabricating the interconnection structure according to claim 11, wherein:
    deposition of the silicon-doped material is performed for multiple times; and
    a process time to introduce $SiH_4$ gradually decreases during the multiple times of the deposition of the silicon-doped material.

14. An interconnection structure, comprising:
    a substrate;
    a dielectric layer formed on the substrate;
    a conductive structure formed in the dielectric layer; and
    a cap layer doped with silicon and formed on the conductive structure and the dielectric layer, wherein along a direction away from the conductive structure, a doping concentration of silicon in the cap layer gradually decreases.

15. The interconnection structure according to claim 14, wherein:
    the cap layer is made of a material including silicon-doped AlN.

16. The interconnection structure according to claim 14, wherein:
    an atomic percentage of the silicon doped in the cap layer is in a range of approximately 10% to approximately 20%.

17. The interconnection structure according to claim 14, wherein the cap layer has a bi-layer structure including:
    an AlSiN layer; and
    an AlN layer formed on the AlSiN layer.

18. The interconnection structure according to claim 17, wherein:
    a ratio between a thickness of the AlSiN layer and a thickness of the AlN layer is in a range of 3:1 to 2:1.

19. The interconnection structure according to claim 14, wherein:
    the dielectric layer is made of an ultra-low-k dielectric material with a dielectric constant lower than 2.5; and
    the conductive structure is made of Cu.

* * * * *